United States Patent [19]

Naya et al.

[11] Patent Number: 5,231,643
[45] Date of Patent: Jul. 27, 1993

[54] OPTICAL FREQUENCY CONVERTER OF BULK RESONATOR STRUCTURE

[75] Inventors: Masayuki Naya, Shizuoka; Yoji Okazaki, Kanagawa, both of Japan

[73] Assignee: Fuji Photo Film Co., Ltd., Kanagawa, Japan

[21] Appl. No.: 883,196

[22] Filed: May 14, 1992

[30] Foreign Application Priority Data

May 15, 1991 [JP] Japan ................... 3-110118

[51] Int. Cl.$^5$ .............................. H01S 3/083
[52] U.S. Cl. ........................ 372/94; 372/22
[58] Field of Search ............. 372/22, 94, 96; 307/425

[56] References Cited

U.S. PATENT DOCUMENTS

| | | | |
|---|---|---|---|
| 4,884,276 | 11/1989 | Dixon et al. | |
| 5,027,361 | 6/1991 | Kozlovsky et al. | 372/22 |
| 5,077,748 | 12/1991 | Kozlovsky et al. | 372/22 |
| 5,111,468 | 5/1992 | Kozlovsky et al. | 372/94 |
| 5,119,383 | 6/1992 | Duling et al. | 372/94 |
| 5,124,999 | 6/1992 | Okazaki et al. | 372/22 |

OTHER PUBLICATIONS

Applied Physics Letters of American Institute of Physics, vol. 56, No. 23, pp. 2291-2292, Jun. 4, 1990 "Generation of 41 mW of Blue Radiation by Frequency Doubling of a GAAlAs Diode Laser", Kozlovsky et al.
Seno et al, "Laser and Atomic Oscillators and Ultimate Photon Optics" Symposium, Jan. 1990, pp. 38-39.

*Primary Examiner*—Frank Gonzalez
*Assistant Examiner*—Robert E. Wise
*Attorney, Agent, or Firm*—Sughrue Mion Zinn Macpeak & Seas

[57] ABSTRACT

There is disclosed an optical frequency converter of a bulk resonator structure comprising a ring resonator or V-shaped resonator made of a nonlinear optical crystal. The converter is equipped with a means for returning a laser light emitted by a semiconductor laser resonating inside the resonator to the semiconductor laser. The ring resonator or V-shaped resonator is made small in size and compact. The converter is insusceptible to vibration and needs no adjustment. Returning laser light is produced at less locations. The loss of the output light inside the resonator is reduced. The second harmonic is generated at a high efficiency. Multiple reflection is produced inside the resonator to further enhance the efficiency of the generation of the second harmonic of the laser radiation. Also, the phase of the radiation can be made uniform. The optical density can be increased.

10 Claims, 4 Drawing Sheets

OPTICAL FREQUENCY CONVERTER OF BULK RESONATOR STRUCTURE

BACKGROUND OF THE INVENTION

The present invention relates to an optical frequency converter utilizing a nonlinear optical effect and, more particularly, to an optical frequency converter which uses a ring resonator or a V-shaped resonator composed of a nonlinear optical crystal to stably convert a frequency of a fundamental harmonic of the laser light emitted by a semiconductor laser into a different frequency.

It has been heretofore known that the light of higher harmonics is generated, utilizing a nonlinear optical effect, by causing the light to enter a nonlinear medium or nonlinear optical crystal. For example, if a second-order nonlinear medium which is adapted for second-harmonic generation (SHG) and is not symmetrical about its center is used, it is easy to produce light of frequency $2\omega$ simply by making laser of frequency $\omega$ enter the medium. Therefore, media of this kind are frequently used as optical frequency converters which convert input frequencies (input wavelengths) into higher frequencies (shorter wavelengths). Second harmonics are generated efficiently where phase matching conditions are satisfied. More specifically, if the nonlinear medium of interest has birefringence, and if the crystal orientation and the polarizing characteristics of the optics are such that the refractive index for the second harmonic agrees with the refractive index for the fundamental harmonic (fundamental wave), the phase matching conditions are met. Examples of nonlinear materials which can be used for second-harmonic generation and can be phase-matched are $KH_2PO_4$(KDP), $LiNbO_3$, $KNbO_3$, KTP, $Ag_3AsS_3$, $CO(NH_2)_2$ (urea), and the like.

An optical frequency converter comprising a ring resonator in which the aforementioned devices for the light of the second-harmonic generation are arranged symmetrically to stably generate the second harmonic has been known. Various types of this converter have been proposed. One kind is described in U S. Pat. No. 4,884,276. In this respect, semiconductor lasers are inferior in light frequency stability (or wavelength stability) to gas lasers. Therefore, it has become increasingly important that the laser light frequency (or the wavelength of the laser light) from a semiconductor laser be stabilized. One method of satisfying this requirement is to use laser light returning from a ring resonator in such a way that the semiconductor laser emits laser light of a stabilized laser light frequency (or wavelength).

High-output gas lasers such as Ar ion lasers are available. However, they are large in size and have low current conversion efficiencies. In addition, their power supply is large and needs to be water-cooled. Consequently, there is a demand for a compact laser light source.

Figure 9:
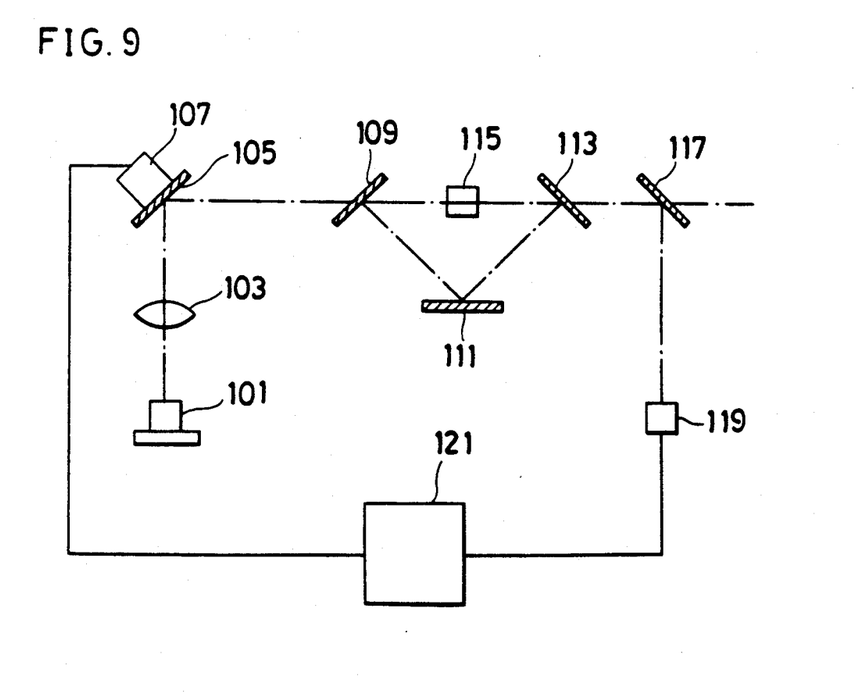
FIG. 9 is a schematic constitutional diagram of the prior art optical frequency converter.

For instance, Seno et al. have proposed an optical frequency converter in Preprint of "Laser and Atomic Oscillators and Ultimate Photon Optics" Symposium, 1990, p. 38. This converter is shown in FIG. 9, and comprises a diode laser 101, a lens 103, a mirror 105 whose position can be varied quite slightly by a PZT (lead zirconate titanate) device 107, two partially transmitting mirrors 109, 113 and a totally reflecting mirror 111 which are arranged in a predetermined manner to form a ring resonator, a crystal device 115 for second-harmonic generation which is placed in one geometrical light path inside the ring resonator, a dichroic mirror 117 which transmits the second harmonic exiting from the ring resonator as the output light and which reflects the laser light of the semiconductor laser leaking from the ring resonator to use the leaking laser light for electrical feedback, a light detector 119 which detects the leaking laser light, that is, the fundamental harmonic, and a signal processing-circuit 121 which processes the output signal from the detector 119 and which activates the PZT device 107 in response to the obtained signal so that the mirror 105 moves a quite small distance for varying the length of the optical path.

In the optical frequency converter described above, a part of the laser light traveling on the resonant mode is reflected by one end surface of the device 115 for second-harmonic generation incorporated in the ring resonator comprising the mirrors 109, 111, and 113 and returned to the diode laser 101. Generally, this part of the laser light is termed the returning (laser) light. If this returning light goes back to the diode laser 101 when the ring resonator is resonating, then the oscillation frequency of the diode laser 101 is automatically locked to the resonant frequency of the returning light. This phenomenon is known as mode locking by optical feedback. As a result, fluctuations of the frequency are suppressed. Consequently, the diode laser 101 emits laser light of a frequency substantially equal to the resonant frequency of the ring resonator. Thus, ring resonator stably produces the second harmonic of the laser light.

In the ring resonator constructed as described above and using the device for second-harmonic generation, two end surfaces produce returning light. That is, the laser light reflection occurs at two locations. Therefore, the resonating laser light is consumed by the returning light. This gives rise to a loss of the laser, thus deteriorating the efficiency at which the laser is converted into the second harmonic. Also, dust in the air tends to adhere to the mirrors, reducing the internal energy of the resonator. The result is that the output is decreased.

As described in the Applied Physics Letters of American Institute of Physics, Vol. 56, No. 23, Jun. 4, 1990, pp. 2291-2292, a monolithic ring resonator is known. With this resonator, however, the frequency of a semiconductor laser must be stabilized by the use of an external electrical signal in order to obtain the second harmonic stably. Furthermore, an optical isolator is needed. For these reasons, this resonator is expensive Moreover, it is impossible to sufficiently regulate the frequency only by the external signal The produced second harmonic is unstable. The ring resonator using the half-mirrors of the above-described construction is about several centimeters square and so it is difficult to miniaturize the resonator. Also, much labor is needed to adjust it. Furthermore, it is susceptible to vibration.

BRIEF SUMMARY OF THE INVENTION

It is a main object of the present invention to solve the aforementioned problems of the prior art and to provide an optical frequency converter equipped with a small-sized, compact resonator (a ring resonator or a V-shaped resonator) which needs no adjustment and is insusceptible to vibration. This converter relieves the need for a feedback circuit by designing the optical system so that a length of the optical path of the optical system which returns light has a fixed optical path length.

It is another object of the invention to provide an optical frequency converter that has less locations at which returning light is produced, has a resonator in which the loss of the light output is small, and produces the second harmonic at a high efficiency.

It is a further object of the invention to provide an optical frequency converter having a resonator in which resonance is induced to superimpose the phases of the second harmonics, for improving the efficiency of the second-harmonic generation and for increasing the output power.

To achieve the above-described objects, there is provided by an embodiment of its first aspect of the present invention an optical frequency converter for converting a frequency of laser light emitted by a semiconductor laser into a different frequency, said optical frequency converter comprising:

a ring resonator into which the laser light emitted by the semiconductor laser is directed and in which the laser light is resonated, said ring resonator being equipped with a means for returning a part of the resonating laser light as a returning light to the semiconductor laser, said ring resonator having a bulk resonator structure composed of a nonlinear optical crystal.

Preferably, said means for returning a part of the resonating laser light to the semiconductor laser is a cement used at an interface of the nonlinear optical crystal of the bulk resonator structure.

There is provided by another embodiment of its first aspect of the present invention an optical frequency converter for converting a frequency of laser light emitted by a semiconductor laser into a different frequency, said optical frequency converter comprising:

said ring resonator having a bulk resonator structure composed of a nonlinear optical crystal and a block of other optical material bonded to the nonlinear optical crystal, said ring resonator being formed so that only the resonating laser light of the resonant mode of the resonator reflected by the bonded surface is returned to the semiconductor laser.

There is provided by its second aspect of the present invention an optical frequency converter for converting a frequency of laser light emitted by a semiconductor laser into a different frequency, said optical frequency converter comprising:

a V-shaped resonator into which the laser light emitted by the semiconductor laser is directed and in which the laser light is resonated, said V-shaped resonator being composed of a nonlinear optical crystal being a monolithic hemisphere, the resonator being formed so that only the resonating laser light of the resonant mode of the resonator reflected by a given spherical surface of the hemispherical nonlinear optical crystal is returned to the semiconductor laser.

There is provided by its third aspect of the present invention an optical frequency converter for converting a frequency of laser light emitted by a semiconductor laser into a different frequency, said optical frequency converter comprising:

a ring resonator into which the laser light emitted by the semiconductor laser is directed and in which the laser light is resonated, said ring resonator having a bulk resonator structure composed of a nonlinear optical crystal; and a diffraction grating disposed outside the ring resonator in an opposite relation to any one of the internal reflecting surfaces of the resonator for the laser light, wherein only the laser light of the resonant mode resonating inside the resonator is reflected by the diffraction grating and returned to the semiconductor laser, and wherein the distance between the diffraction grating and the outer surface is variable.

Preferably, said diffraction grating can be moved toward and away from the outer surface of the ring resonator adjacent to said internal reflecting surface.

Preferably, in each of the above aspects,
(A) said semiconductor laser produces high-power output,
(B) both longitudinal mode and transverse mode of the oscillation of the semiconductor laser are multimode, and
(C) both longitudinal mode and transverse mode are converted into a single mode by said returning light.

Other objects and features of the invention will appear in the course of the description thereof which follows.

DETAILED DESCRIPTION OF THE INVENTION

The optical frequency Convertor of the present invention will be described hereinafter in detail.

The present invention is intended to offer a small-sized semiconductor laser producing a high-power laser of a high frequency (a short wavelength) which would have been heretofore obtained from gas lasers such as Ar ion lasers.

The present invention uses either a ring resonator or a V-shaped resonator. A bulk resonator structure is fabricated from an optical material. In resonance, a part of the laser can be returned to a semiconductor laser and, therefore, frequency fluctuations of the semiconductor laser are suppressed, making use of the light returning from the resonator. Also, the spectrum of the generated radiation can be narrowed. Furthermore, since the bulk resonator structure is adopted, the optical frequency converter is insusceptible to vibration and can be made small in size. The bulk structure referred to herein means structures including monolithic structure and integrated structure In a first aspect of the present invention, a junction surface which produces the returning light is formed inside the ring resonator of the bulk resonator structure. The returning light is generated only at this junction surface. The loss of the resonant energy of the laser due to the generation of the returning light can be reduced.

In a second aspect of the present invention, a V-shaped resonator assuming a hemispherical monolithic structure is employed. Consequently, a junction surface is formed inside the monolithic structure. This makes it unnecessary to join together two components.

In a third aspect of the present invention, a ring resonator assuming a monolithic structure is used. A diffraction grating is disposed outside one internal reflecting surface to produce the returning light. Therefore, a desired amount of the returning light can be obtained by appropriately adjusting the efficiency of the diffraction grating. Since the returning light is produced only at one internal reflecting surface, the loss of the resonator is reduced compared with that of the conventional resonator. In consequence, the second harmonic can be generated at a high efficiency.

In preferred embodiments of the present invention, semiconductor lasers oscillating multimode preferably produce high-power output if both longitudinal mode and transverse mode are multimode. If a multimode laser is employed, the above-described resonator acts as an external resonator. The multimode laser is pulled and locked to the frequency of the external resonator. As a result, the laser becomes a high-output, longitudinal-/transverse, single-mode laser. Hence, the output can be increased while retaining the single mode. In this way, a high output of the second harmonic can be obtained.

The optical frequency convertor of the present invention is described below in more detail with reference to the preferred embodiments shown in the accompanying drawings.

Figure 1:
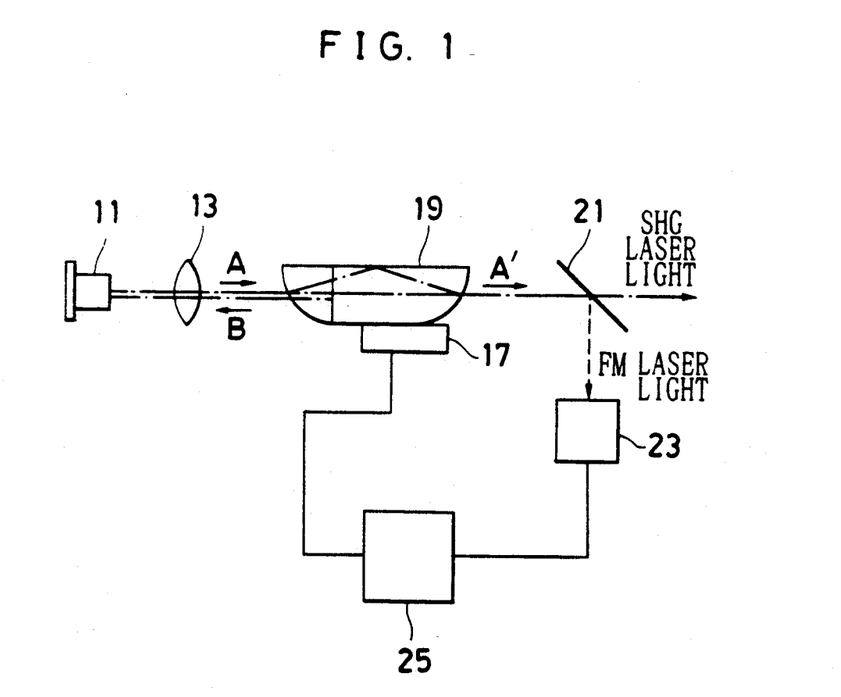
FIG. 1 is a schematic constitutional diagram showing an embodiment of an optical system using an optical frequency converter according to the present invention.

Referring to FIG. 1, there is shown an optical frequency converter embodying the concept of the present invention. This optical frequency converter of the present invention shown in FIG. 1 is similar to the prior art optical frequency converter described already in conjunction with FIG. 9 except that a ring resonator 19 is of the bulk type. Specifically, the optical frequency converter of the present invention comprises a laser diode 11 emitting a laser light A, a lens 13, the ring resonator 19 that is a main component of the invention, a PZT device 17 for quite slightly moving the resonator 19, a dichroic mirror 21 that transmits the laser light of the second harmonic wave emitted from the ring resonator 19, a light detector 23 detecting the leaking light of the fundamental harmonic (the fundamental wave) of the laser light reflected by the dichroic mirror 21, and a signal-processing circuit 25 Here, the ring resonator 19 is composed of the bulk structure using a device for second-harmonic generation. The laser light of the second harmonic transmitted through the ring resonator 19 is the output laser light indicated by A'. The dichroic mirror 21 reflects the semiconductor laser light leaking from the ring resonator 19 for optical feedback. The signal-processing circuit 25 processes the output signal from the detector 23 and activates the PZT device 17 in accordance with the signal obtained by the processing, to quite slightly move the ring resonator 19 As a result, the optical path length is varied. Preferably, the above-described optical systems are assembled on a base (not shown) made of a material which hardly expands on heating such as Superimbar. The signal-processing circuit may not be needed at all under circumstances where temperature changes only a little.

As an example, a GaAlAs diode laser producing wavelength of about 860 nm is used as the diode laser 11. The laser light emitted from the diode laser 11 is made to enter a monolithic resonator made of a $KNbO_3$ crystal so that the monolithic resonator emits light of wavelength of about 430 nm (blue light). Generally, the diode laser 11 oscillates on a single longitudinal mode. In the present invention, the laser may oscillate on multimode Examples of the diode laser 11 include Alley Laser manufactured by Spectra Diode Laboratory and Broad Area Laser manufactured by Sony Corporation. Where the laser oscillates the laser light on the multimode in this manner, the light intensity of the generated laser light can be increased. The second harmonic can be generated at a high efficiency, because the efficiency of the light frequency conversion is in proportion to the square of the light intensity. A high-output semiconductor laser, for example, a semiconductor laser producing output power exceeding 150 mW, oscillates normally in a multimode fashion. The multimode laser light emitted by this high-output semiconductor laser can be converted into a single-mode, high-output laser by the novel optical frequency converter of the present invention employing returning light. Semiconductor lasers producing output power exceeding 200 mW can be used more efficiently.

The resonating power inside the resonator constructed in this manner is made maximum in the operation described now. The laser A emitted by the diode laser 11 is directed to the resonator 19 via the lens 13, so that the resonator 19 resonates. The internal power of the resonator 19 is then increased to a high level and, therefore, the frequency of the semiconductor laser is converted into the laser light of the second harmonic at a high efficiency within the nonlinear crystal. The light leaking from the resonator and consisting only of the fundamental harmonic is directed to the light detector 23 by the dichroic mirror 21. In this manner, only the second harmonic is taken out. The output signal from the detector 23 corresponds to the intensity of the laser, and is sent to the signal-processing circuit 25. This processing circuit 25 controls the PZT device 17 in such a way that the intensity of the laser is maintained constant. The PZT device 17 is attached to the rear surface or the bottom surface of the ring resonator 19 and capable of fine adjusting the angles of the mirrors such that fluctuations of the optical path length due to movement of air in the optical path of the laser light A are prevented and then the length of the optical path is constant. The signal processing circuit 25 is operated, using the well-known regulating techniques.

Figure 2:
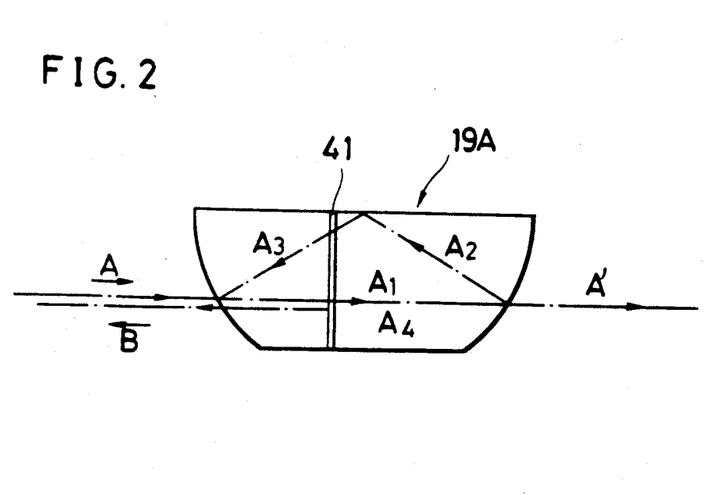
FIG. 2 is a schematic sectional view showing an embodiment of a ring resonator composed of a bulk resonator structure according to the present invention.

The ring resonator having the bulk resonator structure which constitutes the main portion of the present invention is described in detail below. This ring resonator can take various aspects. A first embodiment of a first aspect of the present invention is shown in FIG. 2, where two devices for second-harmonic generation (SHG) are bonded together via an optical cement 41 to form a resonator 19A having the bulk resonator structure. In this structure, a layer of the optical cement 41 of a different material from the SHG device (nonlinear optical crystal) is formed at the interface between the two devices for second-harmonic generation. A slight difference in refractive index exists between the optical cement and the nonlinear optical crystal, thus producing Fresnel reflection. In this way, the returning light B returning to the diode laser 11 is produced. Light loss due to the returning light B occurs twice inside the resonator, but nearly 100% of the second harmonic of the laser is reflected at the other reflecting surfaces. Therefore, the light follows predetermined geometrical optical paths inside the resonator, i.e., optical paths of $A_1$, $A_2$, $A_3$, and $A_4$, and resonance takes place.

Figure 3:
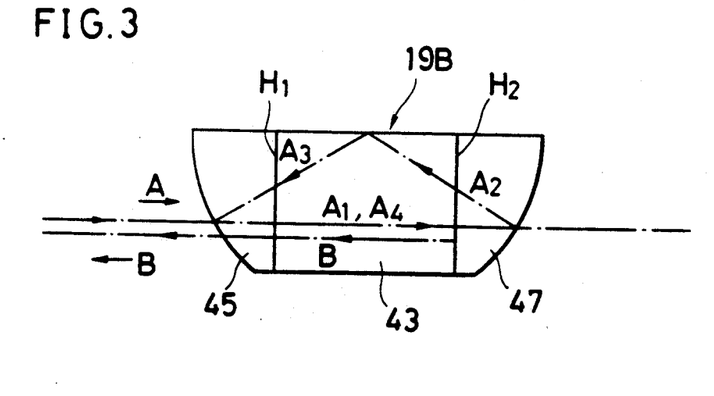
FIG. 3 is a schematic sectional view showing another embodiment of a ring resonator composed of a bulk resonator structure according to the present invention.

Another embodiment of the first aspect of the present invention is shown in FIG. 3, where a bulk resonator is indicated by 19B. This bulk resonator 19B comprises a second-harmonic generation (SHG) device 43 forming a core and two glass portions 45 and 47 bonded to opposite sides of the device 43. The glass portions 45 and 47 are made of an optical glass and each has an end surface of a predetermined shape. Returning light is produced at the interface $H_1$ between the device 43 and the glass mirror 45 and at the interface $H_2$ between the device 43 and the glass portion 47. The resonating laser light is lost at these interfaces $H_1$ and $H_2$. In this example, the more laser light passes through the interfaces, i.e., $H_1$ and $H_2$, the more light loss is produced. The efficiency at which the second harmonic is generated deteriorates somewhat. However, the device 43 for second-harmonic generation has a simple structure. Therefore, it is easy to form the bulk resonator structure. Furthermore, since the mirrors are made of glass, they can be worked easily. Hence, the cost can be curtailed.

In fabricating each of the resonators 19A and 19B in practice, for example, both end surfaces of a crystal of $KNbO_3$ having a length of 7 mm are polished into curved surfaces with R=5 mm. When laser of 160 mW is made to enter the resonator 19B, the obtained second harmonic of the laser is 10 mW. When laser of 1 W is made to enter the resonator, the resulting second harmonic of the laser is 200 mW.

Figure 4:
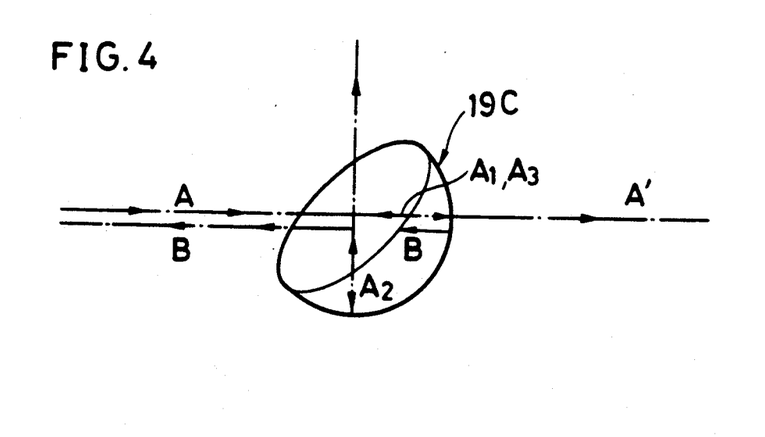
FIG. 4 is a schematic perspective view showing an embodiment of a V-shaped resonator composed of a bulk resonator structure according to the present invention.

A second aspect of the present invention is shown in FIG. 4, where a hemispherical V-shaped resonator is indicated by 19C. This monolithic resonator 19C is manufactured by working a second-harmonic generation device of $KNbO_3$, for example, into a hemispherical form. The radius is about 5 mm, for example. The laser A from a diode laser enters the resonator 19C, follows an optical path $A_i$, is reflected by the spherical surface, follows again the optical path $A_1$, is internally reflected by the plane, reciprocates in an optical path $A_2$, follows again the optical path $A_1$, passes across the spherical surface, and forms a radiated light (output light) A'. A portion of the laser reciprocated in the first geometrical (optical) path $A_1$ is internally reflected at the plane. The remaining portion penetrates the plane and forms returning light B.

Figure 5:
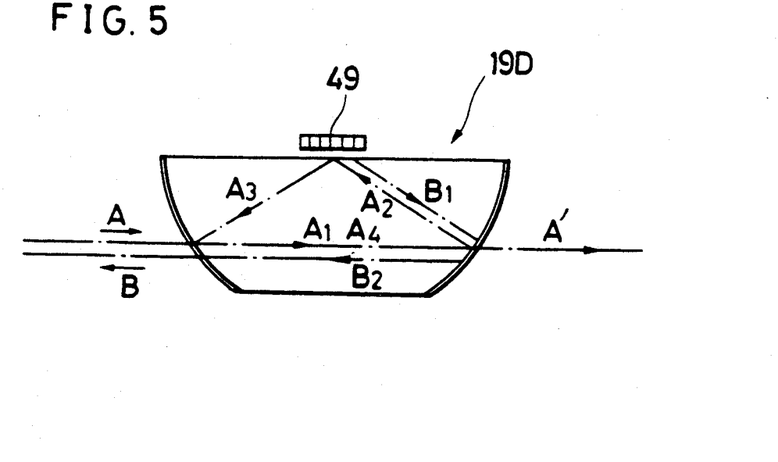
FIG. 5 is a schematic sectional view showing a yet other embodiment of a ring resonator according to the present invention.
Figure 6:
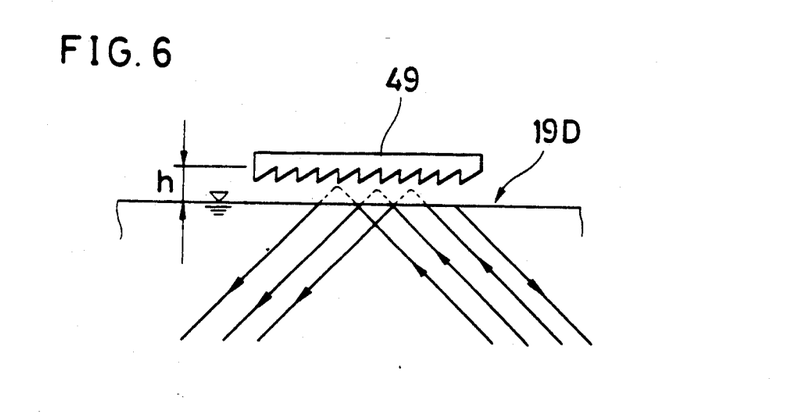
FIG. 6 is a schematic view showing the manner in which returning light is produced by a diffraction grating.
Figure 7:
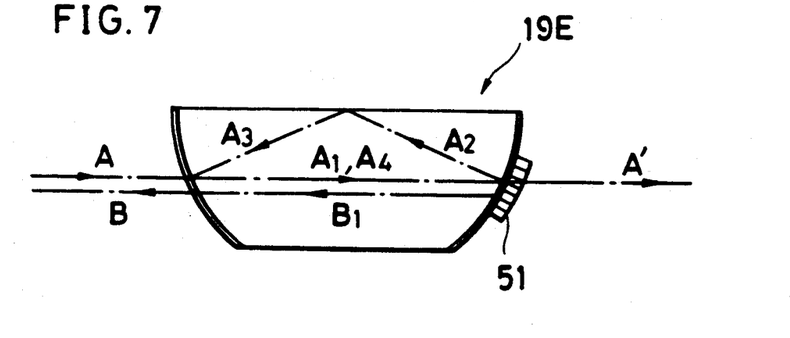
FIG. 7 is a schematic sectional view showing a still other embodiment of a ring resonator according to the present invention.

A novel optical frequency converter of the third aspect of the present invention is next described by referring to FIGS. 5-7 Each of ring resonators 19D and 19E comprises a device for second-harmonic generation This device is shaped into a predetermined form to create a resonator. Light entering at the critical angle is totally reflected by the internal reflecting surface. A diffraction grating 49 is disposed outside any one internal reflecting surface of the ring resonator 19D to produce returning light. Similarly, a diffraction grating 51 is disposed outside any one internal reflecting surface of the ring resonator 19E to produce returning light Preferably, the diffraction grating is the phase type diffraction grating such that it returns 100% of the incident radiation.

A mechanism which produces returning light with the diffraction grating 49 shown in FIG. 5 is now described by referring to FIG. 6. When the laser light enters at the critical angle and is totally reflected by the internal reflecting surface of the resonator shown in FIG. 6, evanescent waves propagate into the outer space from the resonator. Therefore, the internally reflected laser light can be interpreted in such a way that the laser light is reflected after it goes at some extent from the reflecting surface, or the interface, into the outer space. In this case, the diffraction grating is disposed outside the resonator in an opposite relation to the reflecting surface at a predetermined slight distance h. Light energy is transmitted to the diffraction grating by the tunneling effect A given portion of the light impinging on the reflecting surface becomes returning light at the predetermined efficiency. The efficiency of generation of the returning light can be controlled by adjusting the minute distance h.

With respect to a mechanism which produces returning light with the diffraction grating 51 shown in FIG. 7, a coating layer is formed on the end surface from which the second harmonic of the laser light exits. Since this coating layer transmits a fraction of the light, e.g., about 2%, the light energy is transmitted to the diffraction grating 51, which in turn produces returning light. The efficiency at which the returning light is generated can be adjusted by appropriately controlling the reflection efficiency of the grating. In the resonators using the diffraction gratings 49 and 51 shown in FIGS. 5 and 7, respectively, the returning light is produced only at the internal reflecting surface located beside the gratings 49 and 51. Therefore, the loss of light is smaller than in the conventional case in which returning light is produced at two end surfaces. In consequence, the light loss is reduced greatly.

In the structure shown in FIG. 5, light A incident on the resonator 19D follows internal reflection paths $A_1$, $A_2$, $A_3$, and $A_4$, and leaves the resonator as light A'. Returning light B is produced by the diffraction grating 49 when the light goes from the path $A_2$ to the path $A_3$. The returning light B follows internal paths $B_1$ and $B_2$ and goes out of the resonator.

In the structure shown in FIG. 7, light A entering the resonator 19E follows internal reflection paths $A_1$, $A_2$, $A_3$, and $A_4$, and leaves the resonator as light A'. Returning light B is produced by the diffraction grating 51 when the light passes from the path $A_1$ to the path $A_2$. The returning light B follows internal path $B_1$ and goes out of the resonator.

The novel bulk resonators of the present invention have quite small dimensions That is, the bulk resonators 19A, 19B, 19D, and 19E measure 3 mm by 3 mm by 7 mm, for example. Since the monolithic resonator 19C is a hemisphere having a radius of 5 mm, the bulk resonator 19 is placed on the PZT device to cause the bulk resonator 19 itself to move a minute distance along the geometrical path, for varying the optical path length for the laser light. Alternatively, an external mirror placed on the PZT device may be shifted quite slightly to vary the length of the optical path for the laser light.

Figure 8:
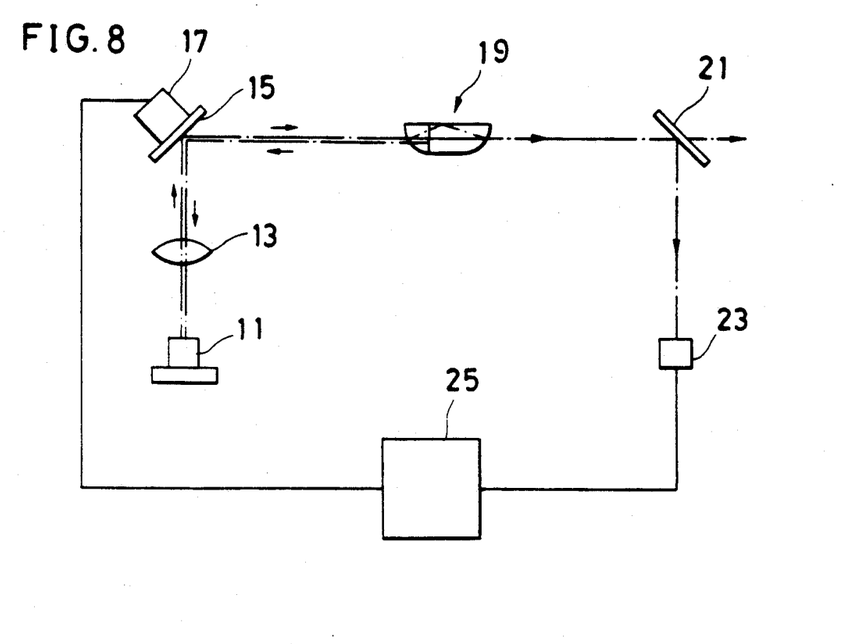
FIG. 8 is a schematic constitutional diagram of another optical frequency converter according to the present invention.

While several embodiments of the invention have been described, the present invention is not limited to them. Rather, various changes and modifications can be made thereto within the spirit and scope of the present invention. For example, as shown in FIG. 8, the ring resonator of the conventional optical frequency converter shown in FIG. 9 can be easily replaced by a ring resonator or a V-shaped resonator of the novel bulk resonator structure of the present invention.

In accordance with the present invention, the ring resonator takes the form of the bulk resonator structure of the optical material. In resonance, a part of the laser light can be returned to the semiconductor laser. Therefore, frequency fluctuations of the semiconductor laser can be suppressed, exploiting the light returning from the ring resonator. Also, the spectrum of the generated light is narrowed. In addition, because of the bulk resonator structure, the converter is resistant to vibration and can be miniaturized Where the junction surface for producing returning light is formed inside the ring resonator of the bulk resonator structure, the returning light is generated only at this junction surface The internal power of the resonator for producing the returning light can be reduced.

Where the V-shaped resonator of a hemispherical monolithic structure is used, the junction surface is formed inside the monolithic structure. This resonator does not need to bond together two portions of the optical materials.

Where a ring resonator having a bulk resonator structure is employed and a diffraction grating is disposed outside one internal reflecting surface to produce returning light, the amount of the returning light can be controlled to a desired level by adequately controlling the efficiency of the grating. Since the returning light is produced only at one internal reflecting surface, the resonator loss is reduced compared with the prior art structure. The second harmonic of the laser light can be generated at a high efficiency.

Where the semiconductor laser oscillates on multi-mode including longitudinal mode and transverse mode, the output power can be increased. Furthermore, the returning light can be controlled with larger tolerance

What is claimed is:

1. An optical frequency converter for converting a frequency of laser light emitted by a semiconductor laser into a different frequency, said optical frequency converter comprising:

a ring resonator into which the laser light emitted by the semiconductor laser is directed and in which the laser light is resonated, said ring resonator including means for returning a part of the resonating laser light, as a returning light, to the semiconductor laser, said ring resonator having a bulk resonator structure comprising a nonlinear optical crystal.

2. The optical frequency converter according to claim 1, wherein said means for returning a part of the resonating laser light to the semiconductor laser comprised a cement used at an interface of the nonlinear optical crystal of the bulk resonator structure.

3. The optical frequency converter according to claim 1, wherein
(A) said semiconductor laser produces high-power output,
(B) both longitudinal mode and transverse mode of the oscillation of the semiconductor laser are multi-mode, and
(C) both longitudinal mode and transverse mode are converted into a single mode by said returning light.

4. An optical frequency converter for converting a frequency of laser light emitted by a semiconductor laser into a different frequency, said optical frequency converter comprising:

a ring resonator into which the laser light emitted by the semiconductor laser is directed and in which the laser light is resonated, said ring resonator having a bulk resonator structure comprising a nonlinear optical crystal and a block of other optical material bonded to the nonlinear optical crystal, said ring resonator being formed so that only the resonating laser light of the resonant mode of the resonator reflected by the bonded surface is returned to the semiconductor laser.

5. The optical frequency converter according to claim 4, wherein
(A) said semiconductor laser produces high-power output,
(B) both longitudinal mode and transverse mode of the oscillation of the semiconductor laser are multi-mode, and
(C) both longitudinal mode and transverse mode are converted into a single mode by said returning light.

6. An optical frequency converter for converting a frequency of laser light emitted by a semiconductor laser into a different frequency, said optical frequency converter comprising:

a V shaped resonator into which the laser light emitted by the semiconductor laser is directed and in which the laser light is resonated, said V-shaped resonator comprising a nonlinear optical crystal, said crystal being a monolithic hemisphere, the resonator being formed so that only the resonating laser light of the resonant mode of the resonator reflected by a given spherical surface of the hemispherical nonlinear optical crystal is returned to the semiconductor laser.

7. The optical frequency converter according to claim 6, wherein
(A) said semiconductor laser produces high-power output,
(B) both longitudinal mode and transverse mode of the oscillation of the semiconductor laser are multi-mode, and
(C) both longitudinal mode and transverse mode are converted into a single mode by said returning light.

8. An optical frequency converter for converting a frequency of laser light emitted by a semiconductor laser into a different frequency, said optical frequency converter comprising:

a ring resonator into which the laser light emitted by the semiconductor laser is directed and in which the laser light is resonated, said ring resonator having a bulk resonator structure, comprising a nonlinear optical crystal; and a diffraction grating disposed outside the ring resonator in an opposite relation to any one of the internal reflecting surfaces of the resonator for the laser light, wherein only the laser light of the resonant mode resonating inside the resonator is reflected by the diffraction grating and returned to the semiconductor laser, and wherein the distance between the diffraction grating and the outer surface is variable.

9. The optical frequency converter according to claim 8, wherein (A) said semiconductor laser produces high-power output, (B) both longitudinal mode and transverse mode of the oscillation of the semiconductor laser are multi-mode, and (C) both longitudinal mode and transverse mode are converted into a single mode by said returning light.

10. The optical frequency converter according to claim 8, wherein said diffraction grating can be moved toward and away from the outer surface of the ring resonator adjacent to said internal reflecting surface.

* * * * *